| United States Patent [19] | [11] Patent Number: 4,860,009 |
| LaRowe | [45] Date of Patent: Aug. 22, 1989 |

[54] BIDIRECTIONAL MULTIFRAME CONVERTER FOR DATA COMMUNICATIONS SYSTEMS

[75] Inventor: Dorian LaRowe, St. Petersburg, Fla.

[73] Assignee: Paradyne Corporation, Largo, Fla.

[21] Appl. No.: 155,226

[22] Filed: Feb. 12, 1988

[51] Int. Cl.$^4$ ............................................. H03M 5/00
[52] U.S. Cl. ........................................ 341/73; 341/89
[58] Field of Search ...................... 341/52, 56, 69, 73, 341/89

[56] References Cited

U.S. PATENT DOCUMENTS 4,442,528  4/1984  Fukuda .................................. 341/73
4,503,546  3/1985  Yoshine et al. ....................... 341/73
4,556,868  12/1985  Härle .................................... 341/73
4,562,422  12/1985  Pospischil ............................ 341/73
4,595,907  6/1986  Huffman et al. ...................... 341/89

Primary Examiner—William M. Shoop, Jr.
Assistant Examiner—Marc S. Hoff
Attorney, Agent, or Firm—Kane, Dalsimer, Sullivan, Kurucz, Levy, Eisele & Richard

[57] ABSTRACT

A bidirectional device converts a series of data bits partitioned into first group of frames corresponding to a first type of interface into second groups of frames having a second type of interface. The converter first converts signals from a device operating under the first type of interface to standard bilevel digital signals and then converts the standard bilevel digital signals into the second type of interface.

6 Claims, 16 Drawing Sheets

CONVERT T1 TO NTT

FIG.8 CONVERT NTT TO T1

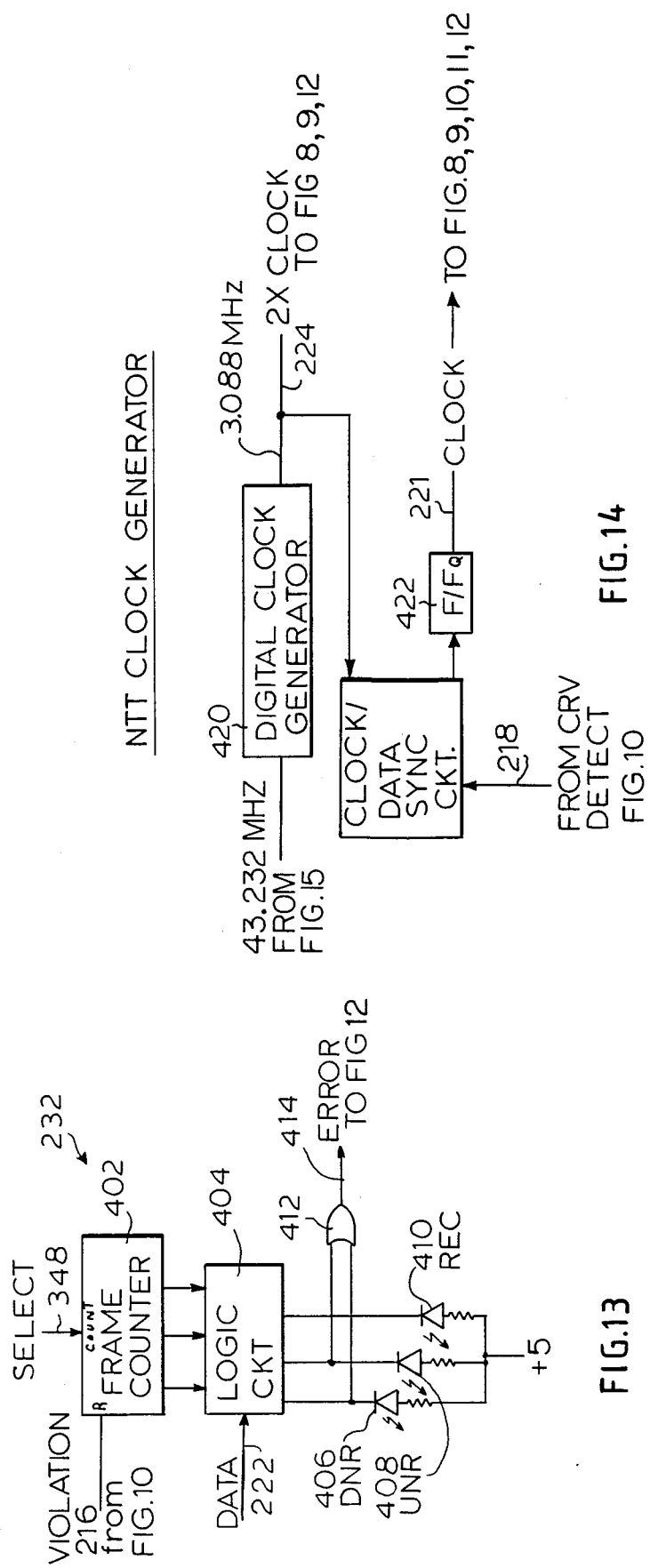

SINGLE FRAME-BIT DESIGNATIONS (HEX)

```
CHAN 1    CHAN 2    CHAN 3    CHAN 4    CHAN 5    CHAN 6    CHAN 7    CHAN 8
00000000  00000000  11111111  11111111  22222222  22222222  33333333  33333333
01234567  89ABCDEF  01234567  89ABCDEF  01234567  89ABCDEF  01234567  89ABCDEF

CHAN 9    CHAN 10   CHAN 11   CHAN 12   CHAN 13   CHAN 14   CHAN 15   CHAN 16
44444444  44444444  55555555  55555555  66666666  66666666  77777777  77777777
01234567  89ABCDEF  01234567  89ABCDEF  01234567  89ABCDEF  01234567  89ABCDEF

CHAN 17   CHAN 18   CHAN 19   CHAN 20   CHAN 21   CHAN 22   CHAN 23   CHAN 24
88888888  88888888  99999999  99999999  AAAAAAAA  AAAAAAAA  BBBBBBBB  BBBBBBBB
01234567  89ABCDEF  01234567  89ABCDEF  01234567  89ABCDEF  01234567  89ABCDEF
```

BIDIRECTIONAL MULTIFRAME CONVERTER FOR DATA COMMUNICATIONS SYSTEMS

BACKGROUND OF THE INVENTION

1. Field of the Invention

This invention pertains to a bidirectional device which converts a series of data bits partitioned into first groups of frames corresponding to a first type of interface into second groups of frames having a second type of interface. More particularly the device converts groups of frames conforming to the T1 (promulgated by American Telephone and Telegraph Company) interface to groups conforming to the NTT (promulgated by the Nippon Telephone and Telegraph Company) interface and vice versa. In addition to the differences in framing, the electrical representation of a data bit changes between T1 & NTT. This is referred to as the Transmission Line Code. T1 incorporates "Alternate Mark Inversion" (AMI) and NTT uses "Coded Mark Inversion" (CMI).

2. Description of the Prior Art

In a typical data communication network, series of data bits are exchanged which are partitioned into groups of frames, each frame comprising a plurality of multi-bit channels and one or more synchronization bits. However there are several ways in which data can be partitioned which are mutually incompatible. Therefore data cannot be exchanged between two systems using different interfaces without an interface converting device therebetween.

OBJECTIVES AND SUMMARY OF THE INVENTION

In view of the above, it is an objective of the present invention to provide an interface converting device. A further objective is to provide a bidirectional converting device, i.e., one that can pass data in either direction.

Yet another objective is to provide a device with means for superimposing secondary frame synchronization on the data at least in one direction.

More particularly, it is an objective of the present invention to provide a bidirectional converter between T1 and NTT interfaces.

Other objectives and advantages of the invention shall become apparent from the following description of the invention.

A converter constructed in accordance with the present invention comprises two sections. Each section can effect a unilateral conversion between different interfaces. Of course, each section could be packaged as a separate unit to provide for a unilateral conversion, and it is within the intent and scope of this invention to cover such an application.

BRIEF DESCRIPTION OF THE FIGURES

FIG. 13 shows details of the display circuit for that segment of FIG. 8;

FIG. 14 shows details of the NTT clock generator shown in FIG. 8;

DETAILED DESCRIPTION OF THE INVENTION

Figure 1:
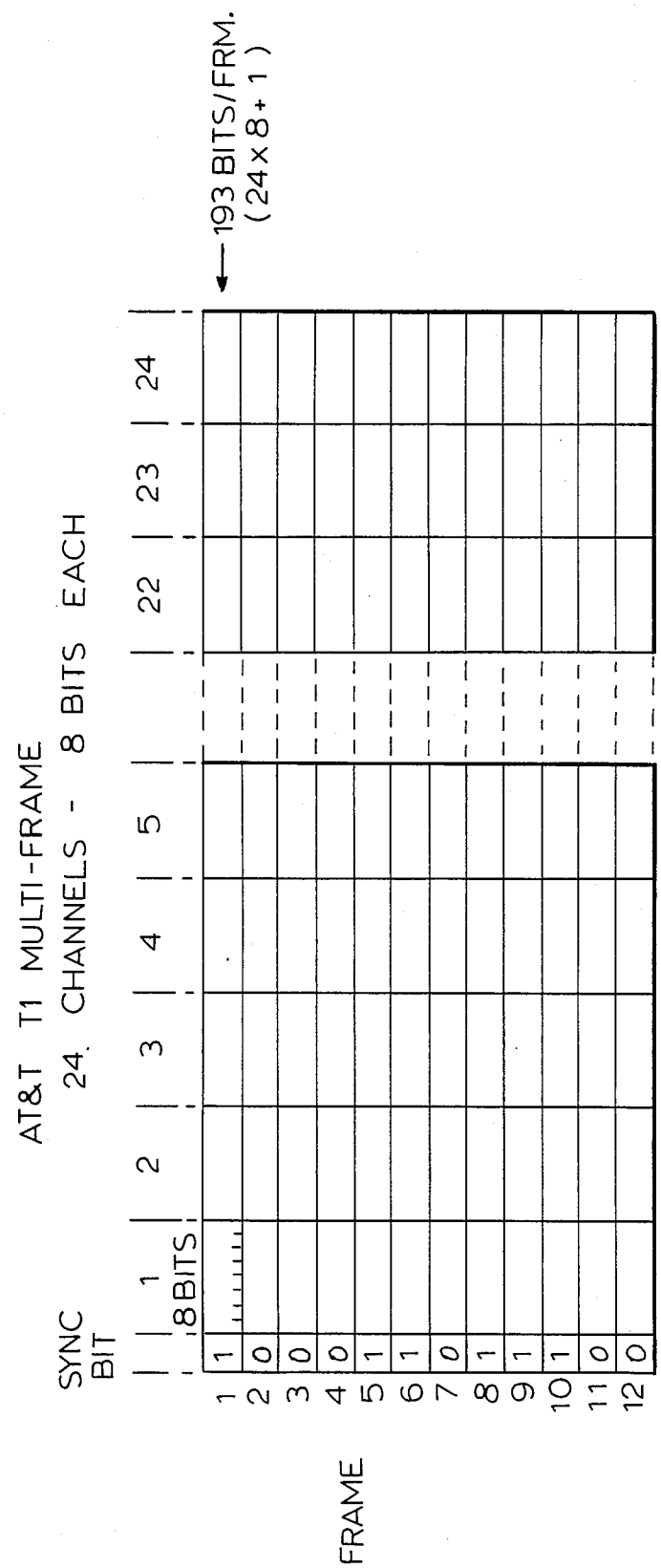
FIG. 1 shows the T1 protocol.

Referring now to the Figures, and more particularly to FIG. 1, the T1 protocol used by AT&T calls for data bits to be partitioned into groups, each group comprising 12 frames. As shown in FIG. 1, each frame 1–12 comprises a sync bit followed by 24 channels of 8 bits each or a total of 193 bits per frame. The sync bits follow a predetermined pattern, such as 100011011100 which is identical for each group. The data is transmitted at a relatively high bit rate such as 1.5 megabits per second.

The NTT protocol calls for groups of 24 frames (FIG. 2), each frame comprising a so-called F-bit followed by 24 channels of 8 bits each. The F-bits are used for various control functions defined below:

TABLE 1

| F-Bit | Description |
| --- | --- |
| C | Coding Rule Violation (CRV) |
| D | Reserved |
| — | Don't Care |
| 1 | Data Transmission Equipment Not Ready (DNR) |
| 2 | Uncontrolled (Remote) Not Ready (UNR) |
| S | Status (Busy) |
| 3 | Sendable/Out of Sync (REC) |

Figure 2:
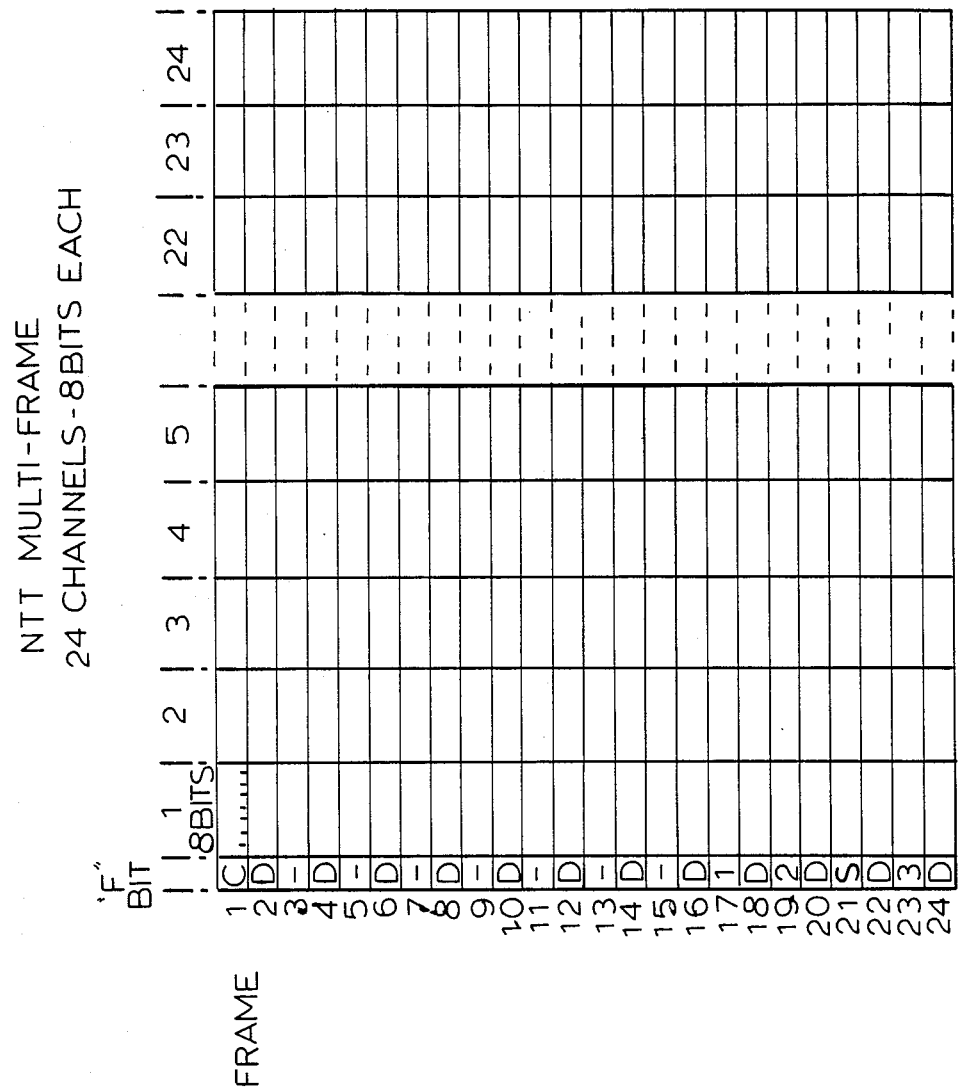
FIG. 2 shows the NTT protocol.

The first bit F of each group, indicated by C in FIG. 2 must be a "1" bit and must be a "coding rule violation" (CRV) so as to signal the transmission facility that this begins a group of frames. A CRV is shown in FIG. 3.

Figure 3:
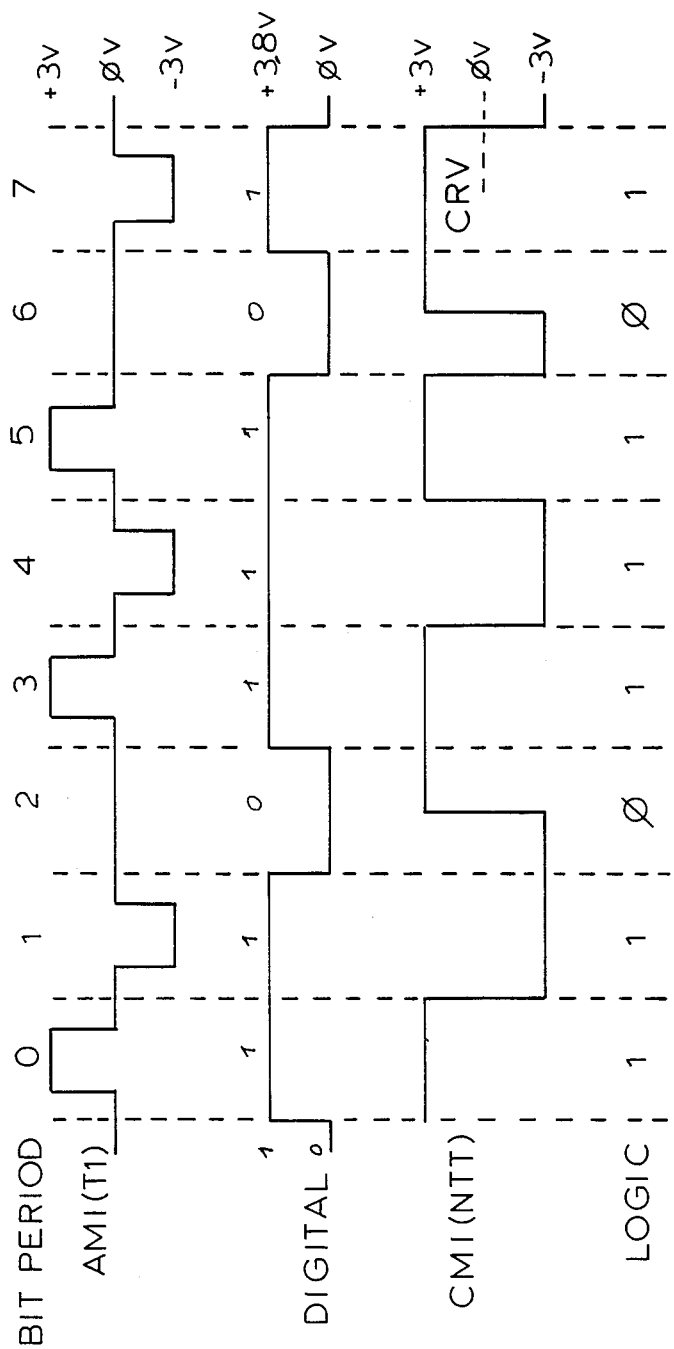
FIG. 3 is a comparison between AMI and CMI coded signals and digital signals.

The actual signal levels for the two protocols are shown in FIG. 3. The T1 protocol calls for the bits to be encoded as AMI (Alternate Mark Inversion) signals. In this type of encoding all logic 0's are represented as signals having a 0 voltage level. Signals corresponding to logic 1's alternate between +3 v and −3 v as shown.

On the other hand the NTT protocol calls for CMI (Coded Mark Inversion)-type signals. In this latter code, logic 1's are still represented alternatively by signals having a level of +3 v or −3 v. However a logic 0 is represented by a transition from −3 v to +3 v in the middle of a bit period.

The C bit (indicating the first frame of a 24 frame-group) is generated by violating the CMI as follows. As previously mentioned, in CMI for logic 1's, the codes alternate between two voltage levels. Thus in FIG. 3, the "1" bit of bit period 3 corresponds to another signal having a voltage level of +3 v. Since in bit periods 5 and 6 a "1" and a "0" are transmitted respectively, the signal during bit periods should be either −3 v (for "1") or a transition from −3 v to +3 v in the middle of the bit period (for "0"). Instead since a "C" bit is desired in period 7, the code is violated by transmitting a "1" bit but without inversion.

Figure 4:
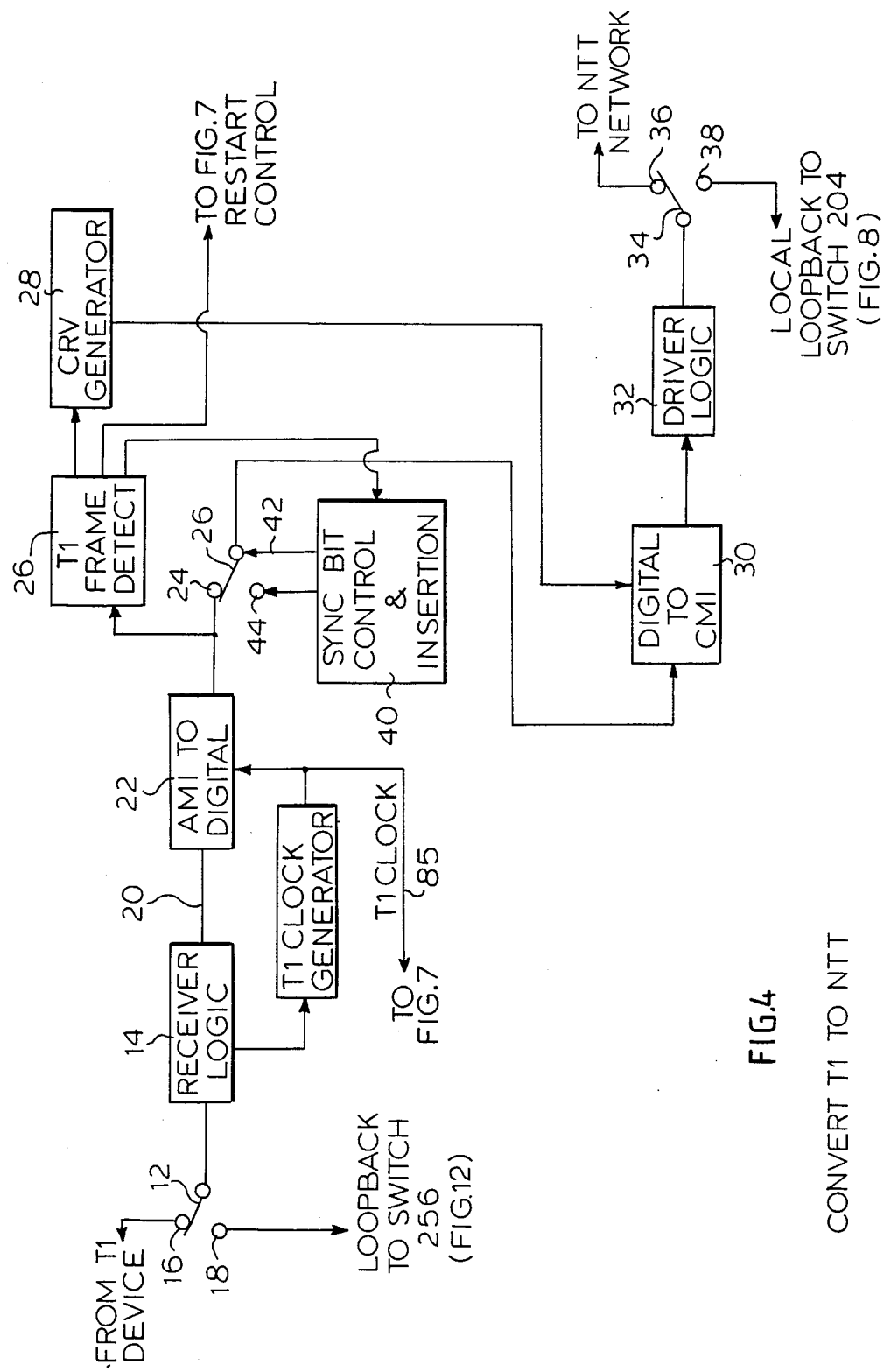
FIG. 4 shows the components of the T1-to-NTT section of a converter constructed in accordance with this invention.

The converter constructed according to this invention has two sections: a first section for conversion from T1 to NTT, and a second section for conversion from NTT to T1. The first section is shown in FIG. 4 and it comprises an input selector switch 12 and a receiver logic circuit 14. The selector switch has two terminals 16, 18. When the switch is contacting terminal 16, signals from a T1 device are transmitted to the receiver logic circuit 14. The terminal 18 is connected to terminal 256 as an alternate means of receiving AMI signals (loopback). The receiver logic circuit is provided as an interface means with the T1 device and it passes AMI signals on line 20. These AMI signals are converted into standard bilevel digital signals (shown in FIG. 3) by digital converter 22. The output of converter 22 is fed to terminal 24 of a detector 26 and to a T1 frame detect circuit 26. The frame detect circuit 26 detects the sync bits of each T1 frame and provides corresponding control signals to a CRV generator 28.

In the position shown in FIG. 4, detector 26 transmits the data digital signals from converter 22 to another converter 30 which assembles the digital frame groups in the NTT format, generates the CRV defined above and then appends the channel bits to each F bit. Obviously the channel bits of two consecutive T1 frame groups may be used to fill the channel bits of an NTT type frame group of FIG. 2. The "C" bit, i.e., the initial bit of each group, is generated by the CRV generator 28. The remaining "F" bits for frames 2-24 are unchanged and sent from converter 22. Converter 30 converts the assembled bits into the CMI format shown in FIG. 2 and transmits them to a driver logic circuit 32. This circuit acts an interface means to an NTT network. The output of circuit 32 is normally passed by an output selector switch 34 and terminal 36 to the NTT network as shown. Terminal 38 on the output selector 34 is connected to switch 202 as an alternate route of sending CMI signals.

It is frequently desirable to provide several secondary sync bits within each NTT frame group. For this purpose there is provided a secondary sync bit control and insertion circuit 40. Circuit 40 receives signal pulses from frame detect circuit 26 indicative of the frames being received. Means are provided to detect when certain designated bits within the frame group is received. Each time one such designated bit is reached, selector 26 is flipped to terminal 44 by a control signal 42 and circuit 40 insets a secondary sync bit to replace the designated bit.

Figure 5:
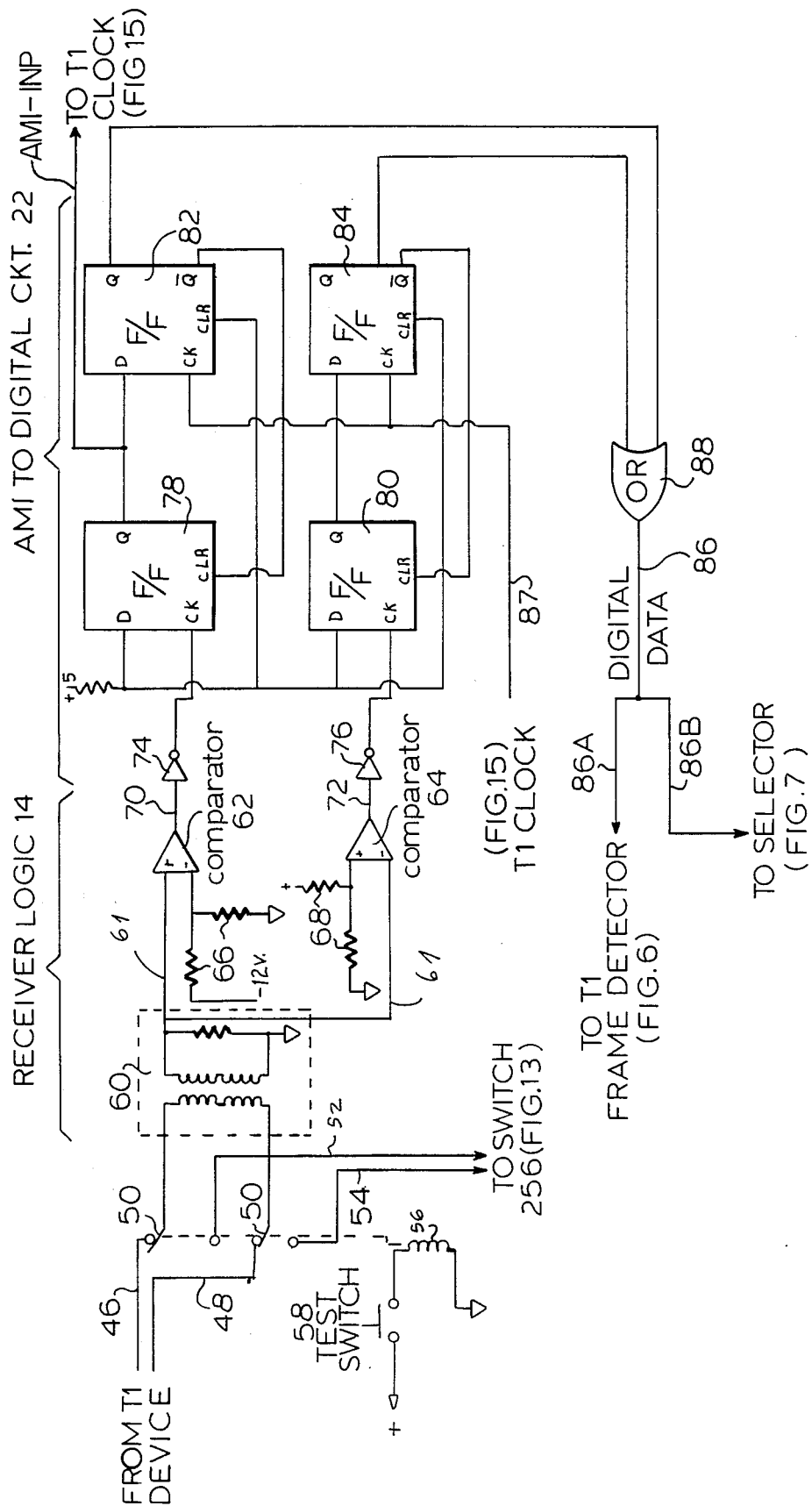
FIG. 5 shows details of the receiver logic and the AMI-to-digital block of FIG. 4.

FIG. 5 shows details of the receiver logic circuit 14 and AMI to digital converter circuit 22. Signals from a T1 network are received on a pair of lines 46, 48 by a DPDT switch 50. Normally the wipers of the switch are connected to lines 46, 48 as shown. However, the switch may also be connected to lines 52 and 54 by activating relay coil 56 (in which case relay 50 comprises contacts activated by switch 58). Relay coil 56 may be activated by a test switch 58.

From switch 50 the signals are fed to a transformer impedance balancing network 60 and then over line 61, to the non-inverting and inverting inputs of two voltage comparators 62 and 64. The inverting input of comparator 62 is connected to a resistive voltage divider 66 set to about −2 v. Similarly the inventory input of comparator 64 is connected to a resistive voltage divider 68 set to about +2 v. Thus the two comparators generate two outputs 70, 72 which are either high or low in accordance with the input from line 61 as shown below.

| Line 61 | Output 70 | Output 72 |
| --- | --- | --- |
| +3.8 | High | Low |
| 0 | High | Low |
| −3.8 | Low | High |

Outputs 70,72 are fed through two inverters 74,76 respectively to a network of four D-type flip-flops. The first two flip-flops 78,80 act as buffer means for holding the information from the respective comparators. The second set of flip-flops 82,84 convert the information from flip-flop 78,80 in accordance with the T1 clock signal on line 87 (derived as described below) into two data streams which are combined into a single digital data stream on line 86 by OR gate 88. One of the outputs Q of the flip-flops 82,84 is high when the voltage in line 61 is either +3.8 or −3.8 v, and low when the voltage on line 51 is 0 v. Thus the circuit 22 effectively converts AMI signals into straight digital bits.

Line 86 has two branches 86A,86B. Branch 86A transmits the data to the T1 frames detector 26 shown in FIG. 6 and to the selector shown in FIG. 7.

Figure 6:
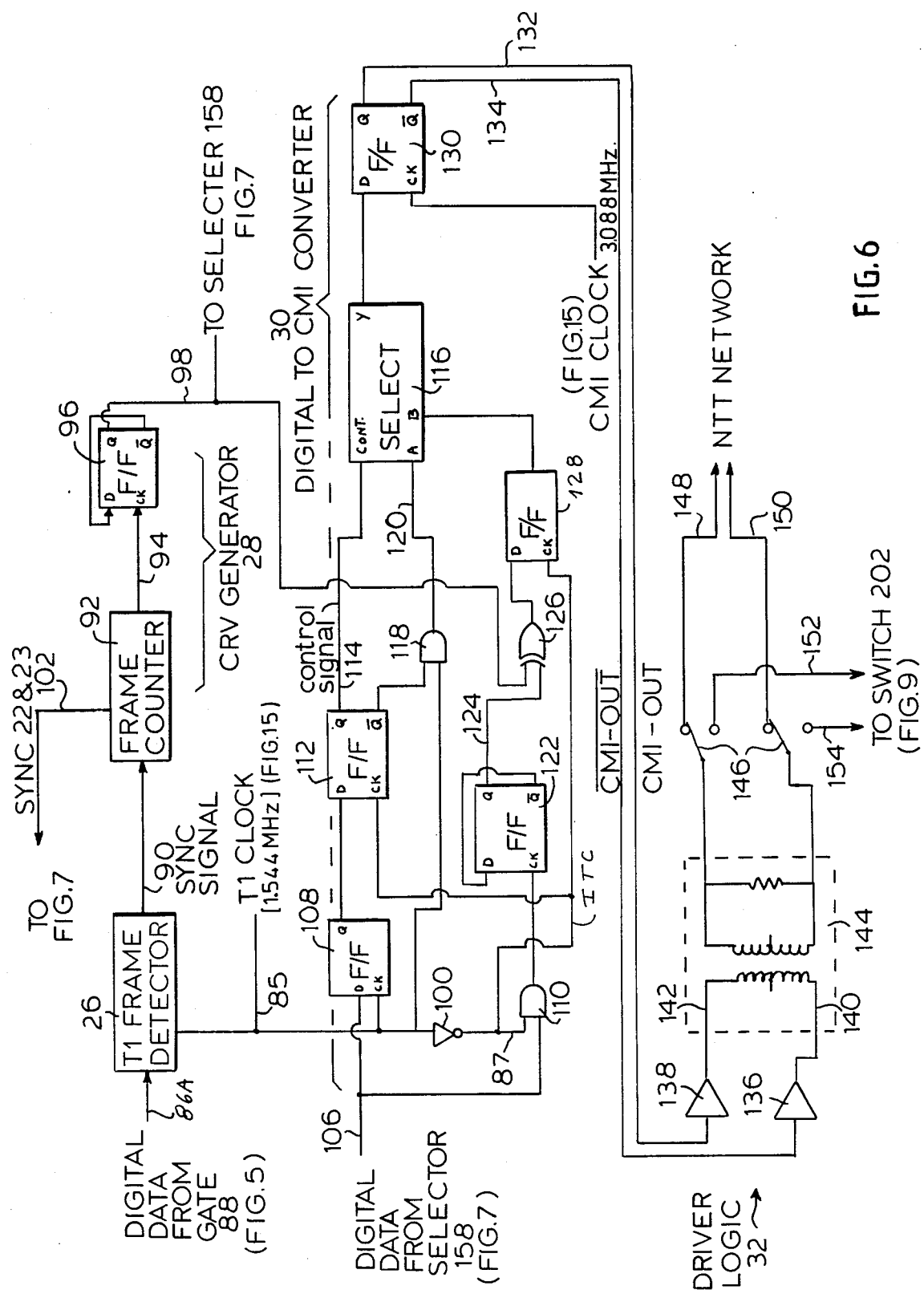
FIG. 6 shows details of the CRV generator, digital-to-CMI, and driver logic circuits for these sections of FIG. 4.
Figure 15:
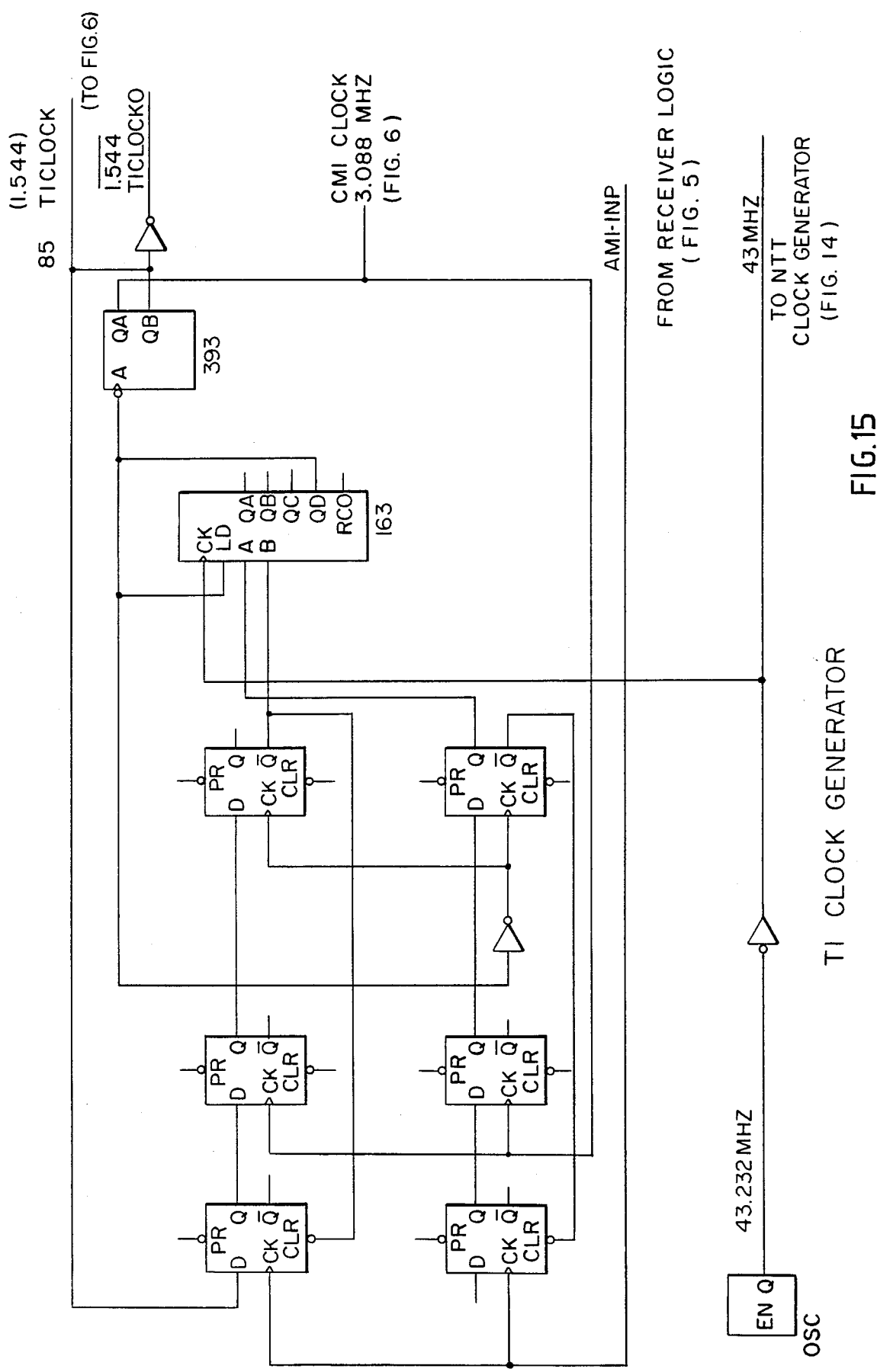
FIG. 15 shows details of the T1 clock generator required in FIG. 6.

FIG. 6 shows details of the CRV generator 28, digital-to-CMI converter 30 and driver logic circuit 32. In FIG. 6, digital data on line 86A is fed into a T1 frame detector 26 which detects the sync signals of each frame from the T1 network. Such detectors are off-the-shelf items readily available, such as for example the Rockwell International R8060. The detector generates a sync signal on line 90 every time a frame sync is detected. This signal is fed to a frame counter 92. Counter 92 generates an output on line 94 for every T1 frame group (i.e. after every 12 frames). The counter output is fed to a divide-by-two flip-flop 96 which generates a VIOLATE signal on line 98 for every 24 frames received, thus indicating the beginning of an NTT frame group. The clock circuit that drives the functions from T1 receive to NTT transmit (T1 clock input 85) is shown in FIG. 15. This clock circuit provides a free running 1.544 MHz clock (without input data present) stepped down from a 43.232 MHz oscillator. Input data from T1 provides the means for this circuit to phase adjust (in small increments) to the receiving bit stream. This particular clock circuit was provided by an existing T1 device (Paradyne DCX T1 MUX) and was only slightly modified for this converter.

Frame counter 92 also generates several other sync signals such as sync 22 and sync 23 on lines 102 and 104 respectively. These signals are sent to the selector circuit of FIG. 7.

Figure 7:
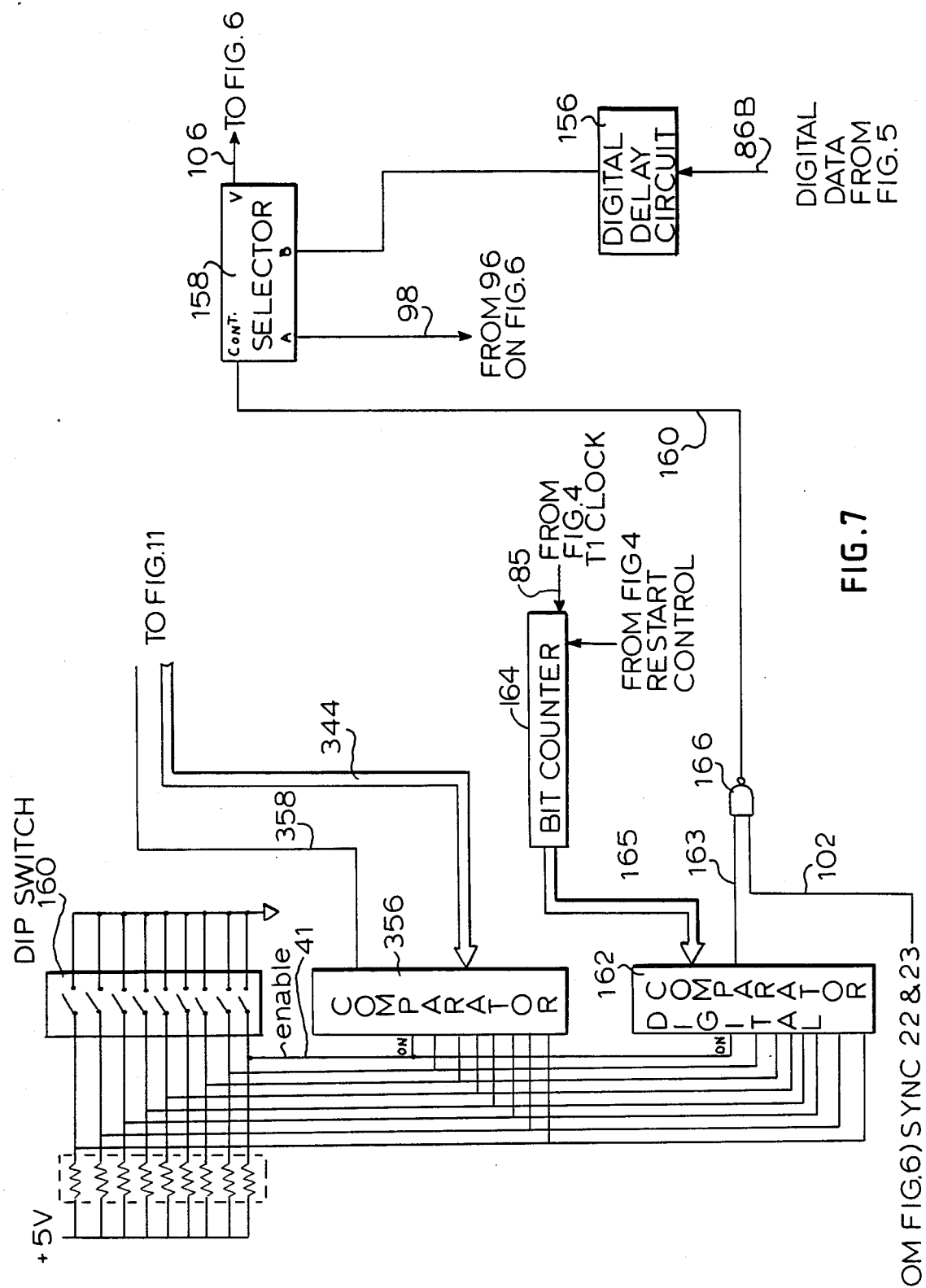
FIG. 7 shows details of the selector and secondary sync bit control and insertion circuits for that section of FIG. 4.

Digital data is received from FIG. 7 on line 106. As shall be described more fully below, this data is almost identical to the data signals on line 86A except for a differential delay, and several (optional) secondary sync bits which have replaced some of the data bits. The data bits from line 106 are fed to a flip-flip 108 and an AND gate 110. The data signals are propagated through flip-flip 108 and a second flip-flop 112 to generate a control signal on line 114 to a selector 116. Selector 116 has two input gates A,B and an output gate and its purpose is to selectively connect one of the input gates to the output gate in accordance with the control signal. Thus if a "0" is received as a control signal in line 114, selector 116 connects gate A to gate Y. For a "1" on line 114, gate B is connected to gate Y. Flip-flop 112 has its inverted output connected to an AND gate 118 which also receives the INTERNAL CLOCK signal as its input. Therefore gate 118 generates an output on line 120 which is low & then high (See CMI "0" on FIG. 3) whenever the flip-flop 112 receives a "0" data bit. This output line 120 is connected to gate A of selector 116 so that every "0" data bit is coded as a CMI "0" bit on the Y output gate of selector 116.

The output of AND gate 110 is fed to a divide-by-two flip-flop 122 which generates an output on line 124 which alternates for each "1" data bit received from gate 110. Line 124 feeds the flip-flop output to a XOR (exclusive OR) gate 126. The output of the XOR gate is fed to a flip-flop 128 which aligns the bits with the T1 clock signal and then feeds the same to gate B of selector 116.

The output gate Y of selector 116 is connected to a flip-flop 130 which aligns the bits from selector 116 with the CMI clock. Flip-flop 130 generates two output signals CMI-OUT and $\overline{\text{CMI-OUT}}$ on lines 132,134 respectively. CMI-OUT signals are shown in FIG. 3 as CMI. $\overline{\text{CMI-OUT}}$ is the inverse of the CMI signal which is required to provide the differential output at 148 and 150.

These two signals are fed to two transfer amplifier stages 138,136 respectively which drive these binary signals into an impedance balancing transformer (circuit 144). Switch 146 selectively transfers the CMI output signals either to a pair of output lines 148,150 coupled to an NTT network or to a pair of internal lines 152,154. Switch 146 is relay controlled, just like switch 50 of FIG. 5.

As previously mentioned the first signal of each NTT frame group must be a CRV. This is accomplished by connecting line 98, which carries the VIOLATE signal, to the second input of XOR gate 126. When the VIOLATE signal toggles, it overrides the "1" bit polarity from line 124 and forces the output of gate 126 to invert all the "1" bit values for the next frame group beginning with the first bit. Violate signal line 98 toggles once each group of 24 frames, thus creating the coding rule violation (CRV) at the beginning of each group of frames and maintaining the alternating "1" polarity (FIG. 3) for the remaining "1" bits until the next frame group begins.

Details of the secondary sync bit injection circuit and the selector circuit are shown in FIG. 7. The Digital data bits from FIG. 5 are received on line 86B and are fed to a digital delay line 156 to delay these bits by nine bit periods. This delay will allow for frame recognition and various control signals to propagate to the converter output circuits of FIG. 6. The delay circuit comprises a couple of flip-flops and a serial in/serial out shift register. The output of the delay circuit 156 is connected to the B input gate of selector 158. Selector 158 also has a control gate (marked CONT. on the drawing), a second input gate A and an output gate Y, and it functions in an identical manner to selector 116 in FIG. 6. As long as a "logic high" is maintained on line 160, selector 158 connects input gate B to the output gate so that the data bits from delay circuit 156 are sent on line 106 to the circuits shown in FIG. 6 (for Transmission).

Also there is provided a nine position DIP switch 160 coupled to a digital comparator 162 (and 356). The digital comparator is also coupled to a bit counter 164 which sequentially counts up to the number of bits per frame (i.e., 193) and then resets and starts counting again. The DIP switch is provided for the selection of the bit position within a frame where a secondary sync bit is to be inserted. For example, if a secondary sync bit is to be inserted into the first bit position of the fourth 8-bit word (see FIG. 16) i.e. the 25th bit position, then the individual switches of the DIP switch are set to generate the binary equivalent of 24 (00011000). Note that the DIP switch contains nine switches. Eight are used for bit selection and the ninth switch (line 41) simply enables or disables this function.

The counter 164 is reset at the beginning of each frame and starts counting the bit periods. This count is sent to the comparator over bus 165. Digital comparator 162 compares the output of counter 164 with the number generated by DIP switch 160 and when it detects a coincidence it sends a "logic high" over line 163 to an AND gate 166.

Line 102 from frame counter 92 (FIG. 6) is used to determine the frames in which secondary bits are required. Since secondary bits are required in frames 22 and 23, the signal on line 102 is used from the counter 92. This line 102 provides the enable for AND gate 166. Therefore, while line 163 goes high (for the selected bit) in each frame (for example during bit period 24), gate 166 blocks this signal until an enabling signal is received from line 102.

Line 98 from FIG. 6 toggles once at the beginning of each frame (to insert a CRV). The bit value that is inserted on frame 22 & 23 must change for each group of frames. Line 98 is used because its value (either 0 or 1) changes with each frame group. Therefore during frames 22 & 23 the inserted bit may be "0" and when the next time frames 22 & 23 arrive the inserted value will be a "1".

Normally the control line 160 to selector 158 is high and the selector connects input B to its output Y. During the 22nd and 23rd frame line 102 goes high enabling gate 166 and causing line 160 to pulse low when bit counter 164 reaches the number set on DIP switch 160. Therefore when the 24th bit period of the 22nd and 23rd frame is reached, the control line 160 goes low switching the selector to gate A. The data bit value at input B will be substituted at output Y by the value at input A. After the 24th bit the selector switches back to gate B.

Figure 8:
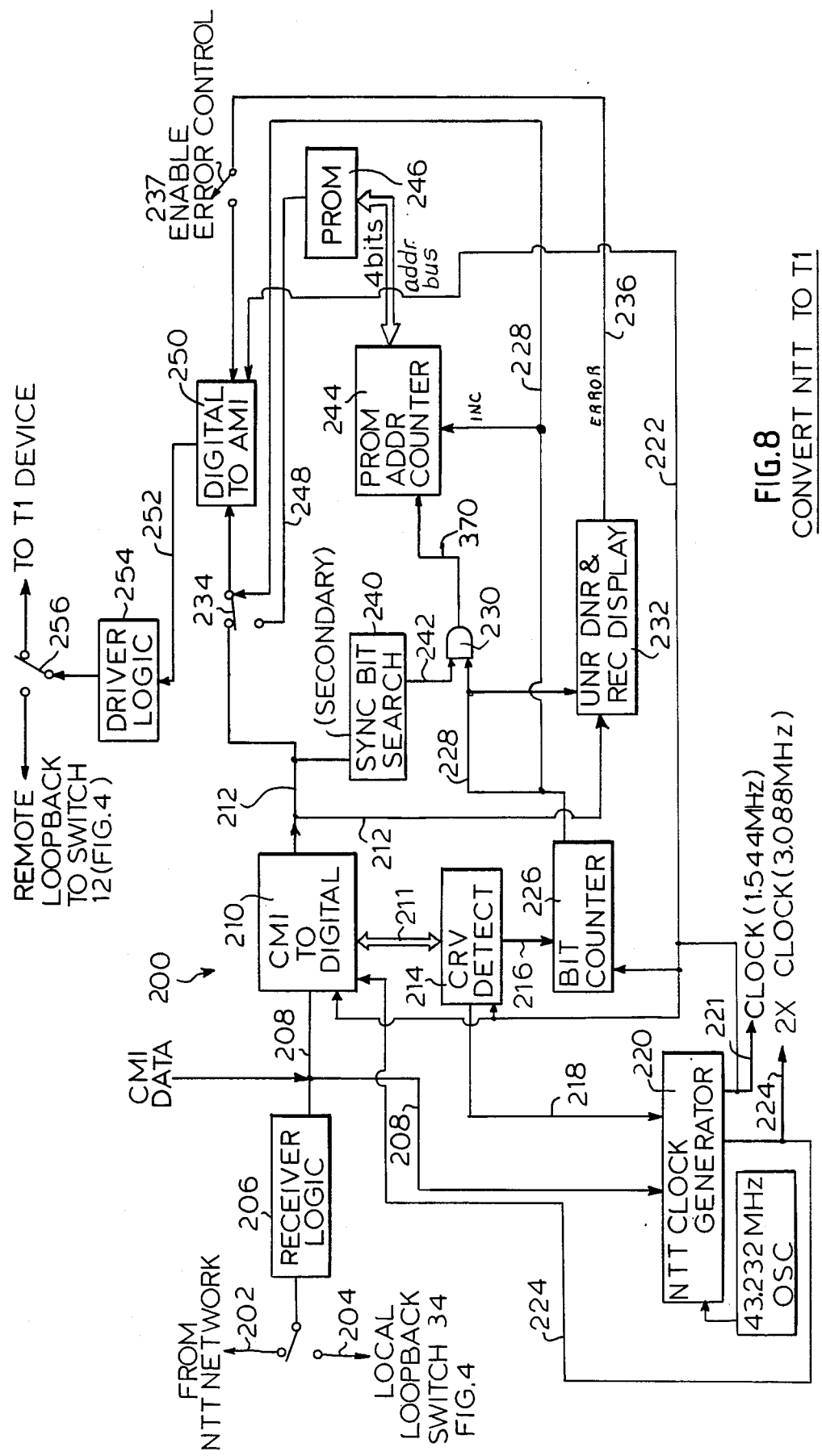
FIG. 8 shows the components of the NTT-to-T1 section of a selector constructed in accordance with the invention.

The second section of the present converter is provided to convert data from an NTT network to a T1 device (such as Paradyne's DCX T1 MUX) are shown in FIG. 8. The section 200 includes a selector switch 202 for selecting an input from an NTT network or from a loopback terminal 204. The data signals conforming to the NTT interface are fed to a receiver logic circuit 206 which translates incoming signals to a digital (TTL) representation of the CMI format on line 208. Line 208 comprises an input to CMI-to-digital circuit 210. This circuit translates CMI bit representations to their corresponding binary equivalents on line 212. Digital information on line 211 is fed to a CRV detect circuit 214 which detects a coding rule violation indicating a new NTT group of frames (as described above) and in response generates a violation signal on line 216 and a CRV signal on line 218. The CRV signal on line 218 and data from line 208 are fed to the NTT clock generator 220 to synchronize CLOCK, and 2X CLOCK signals on lines 222 and 224, respectively, as shall be described more fully below.

The VIOLATION signal is sent on line 216 to BIT COUNTER 226. The bit counter is set to generate a SELECT pulse on line 228 for the first bit of each T1 frame. This SELECT pulse is fed to an enabling gate 230 and a display circuit 232, from address counter 244, and a selector 234. The display circuit 232 displays various error messages indicated by some of the "F" bits in the NTT interface, and in addition generates an ERROR signal on line 236, as discussed below.

The digital data on line 212 is also fed to a sync bit search circuit 240 which searches for the secondary sync bits described in the T1 to NTT converter section When these secondary sync signals are detected an ENABLE signal is sent on line 242 to a second input of AND gate 230 to indicate that a new T1 group of frames is to be initiated. The output of gate 230 is used to reset a PROM address counter 244 while line 228 increments counter 244 to the next bit address The address counter after being reset starts generating consecutive addresses for a PROM 246 at the beginning of each frame. PROM (programmable read only memory) 246 then releases consecutive SYNC bits on line 248 at the beginning of each frame in the sequence defined in FIG. 1. Since the NTT group has 24 frames, the PROM generates the sequence twice for each NTT frame. These sync bits are fed on line 248 to a second terminal of selector 234.

Normally selector 34 picks up only the digital data bits on line 212. However at the beginning of each frame the selector switches over to line 248 under the control of the SELECT signal or line 228 thereby stuffing the SYNC bits into the first bit position of each frame.

The signals from selector 234 are fed to a digital-to-AMI converter circuit 250 which converts them to AMI-coded TTL signals on line 252. The AMI TTL signals are then converted into appropriate T1 signals by a driver logic circuit 254. Finally a switch 256 transmits the signals generated by circuit 254 either to a T1 device or to switch 12 of FIG. 4. When an error signal is received from display circuit 232 by the digital AMI converter, the converter 250 is latched so that it outputs only "1" bits. This function can be disabled by switch 237.

Figure 9:
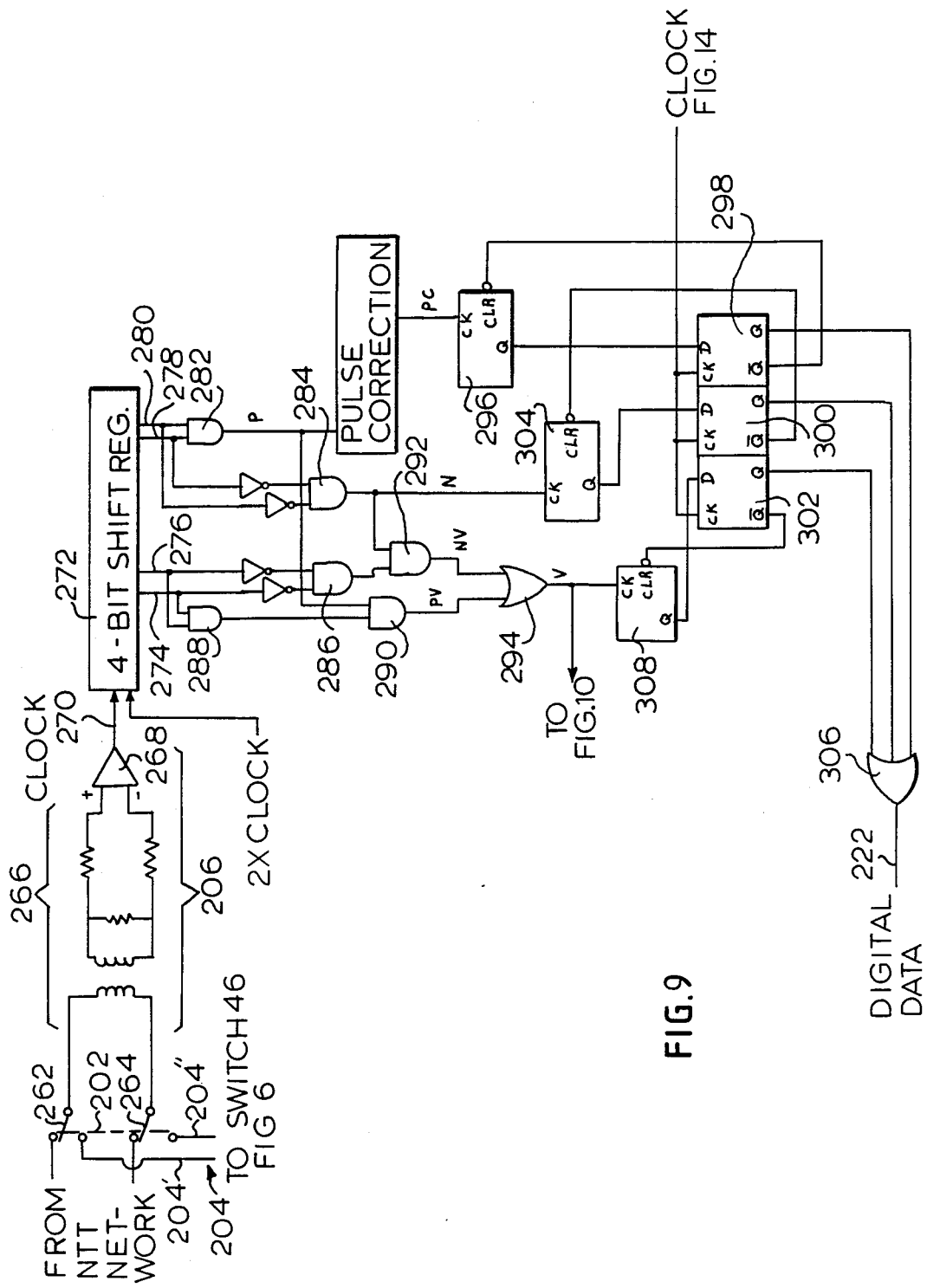
FIG. 9 shows details of the receiver logic circuit and the CMI-to-digital converter circuit for that section of FIG. 8.

The receiver logic circuit and the CMI-to-digital circuit are shown in FIG. 9. Switch 202 is a DPDT switch with two blades 262,264. In the normal position shown in FIG. 9 both blades are connected to incoming lines from an NTT network. In the other position, the blades are connected to two lines 204 discussed below. As the other DPDT input or output switches, switch 202 is relay controlled and activated by a push button on the front panel of this device.

From switch 202, NTT interface signals pass through an impedance balancing transformer network 266 and hence to a voltage comparator 268. The comparator 268 produces CMI coded signals compatible with TTL voltage levels. In other words a high voltage level on line 270 corresponds to a $-3$ v level of the CMI signal as defined in FIG. 3.

The signals on line 270 are fed to a 4-bit serial-in/parallel-out shift register 272 at the 2X clock rate (3.088 MHz).

The CMI CLOCK signal has a period equal to the bit period of the NTT data while the 2X CLOCK period is half as long. Since line 270 is sampled by the shift register at twice the bit period, each output of 272 is $\frac{1}{2}$ bit time behind the previous output.

Figures 16, 17A:
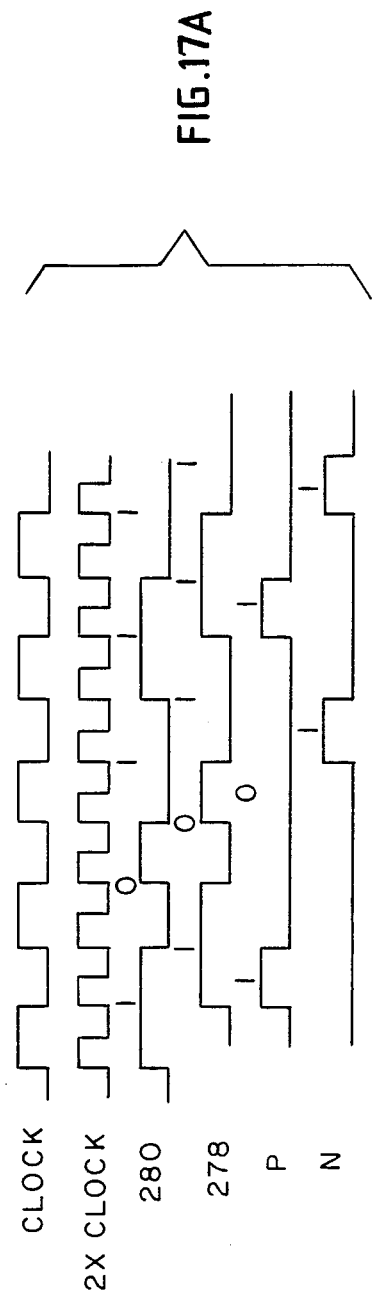
FIG. 16 providing the hexadecimal valve for each bit position within the frame for the secondary framing function.
FIGS. 17a and 17b are graphical representations of various signals in the inventive circuit when CMI data is converted to a digital representation.
Figure 17B:
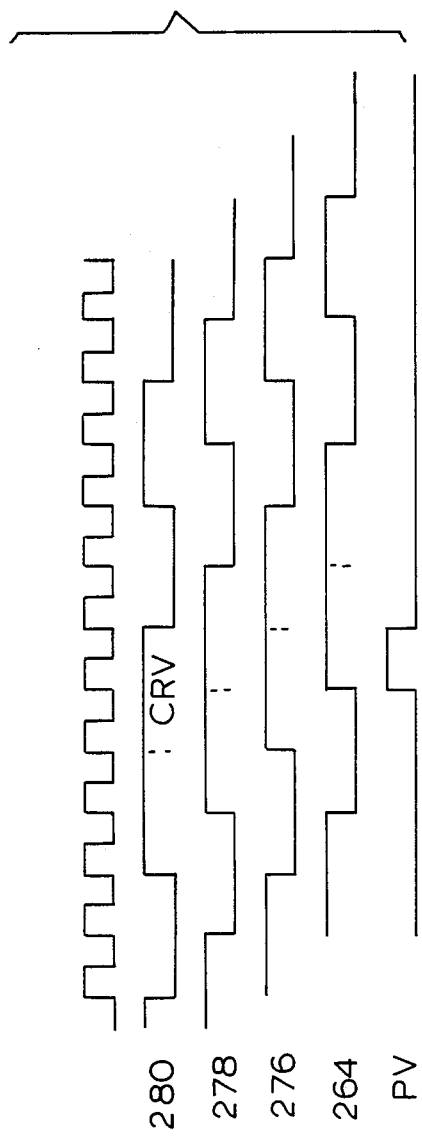

The shift register 272 has four parallel outputs 274,276,278,280 which are fed to an array of gates (282,284,286,288) designed to extract all CMI Coded "1" bits and ignore the CMI coded "0" bits. These gates AND the CMI shifted data to cancel out the "0" data bits and provide a pulse for each CMI coded "1" bit. FIGS. 17a and 17b show the process via a timing diagram and demonstrate how a pulse is generated for each CMI "1" bit. When the CMI data line 280 is "ANDed" with data line 278, a pulse (logic high) is generated for each positive going "1" bit (P). A pulse is also needed for each negative going "1" BIT. This is accomplished by inverting data lines 278 and 280 before "ANDing" them at Gate 284. This method of generating a pulse for each "1" bit does not work when a CRV occurs adjacent to a "1". A pulse is generated for a positive CRV (a CRV is also a "1" bit) that is adjacent to another "1" bit at the output of gate 290 (see FIG. 9). In the same manner, gate 292 produces a pulse for a negative going CRV. These two potential "1" bit data values are "ORed" at gate 294, the output of which is a pulse for a CRV "1" bit. These 3 signals (P, N and V) are first latched by flip-flops 296,304 and 308, then clocked (synchronized) by flip flops 298,300 and 302 respectively. OR gate 306 combines these 3 flip-flops to produce a true TTL digital representation of the received CMI data. When no pulses occur (at P, N or V), the output of gate 306 is low indicating a "0" data bit. The pulse correction as seen on FIG. 9 at the output of Gate 282, is necessary to eliminate false "1" pulses that occur during the low to high transition of a CMI "0" bit (FIG. 3). The signals from the flip-flops 298,300 and 302 are combined into a signal digital data stream on line 222 by OR gate 306.

Figure 10:
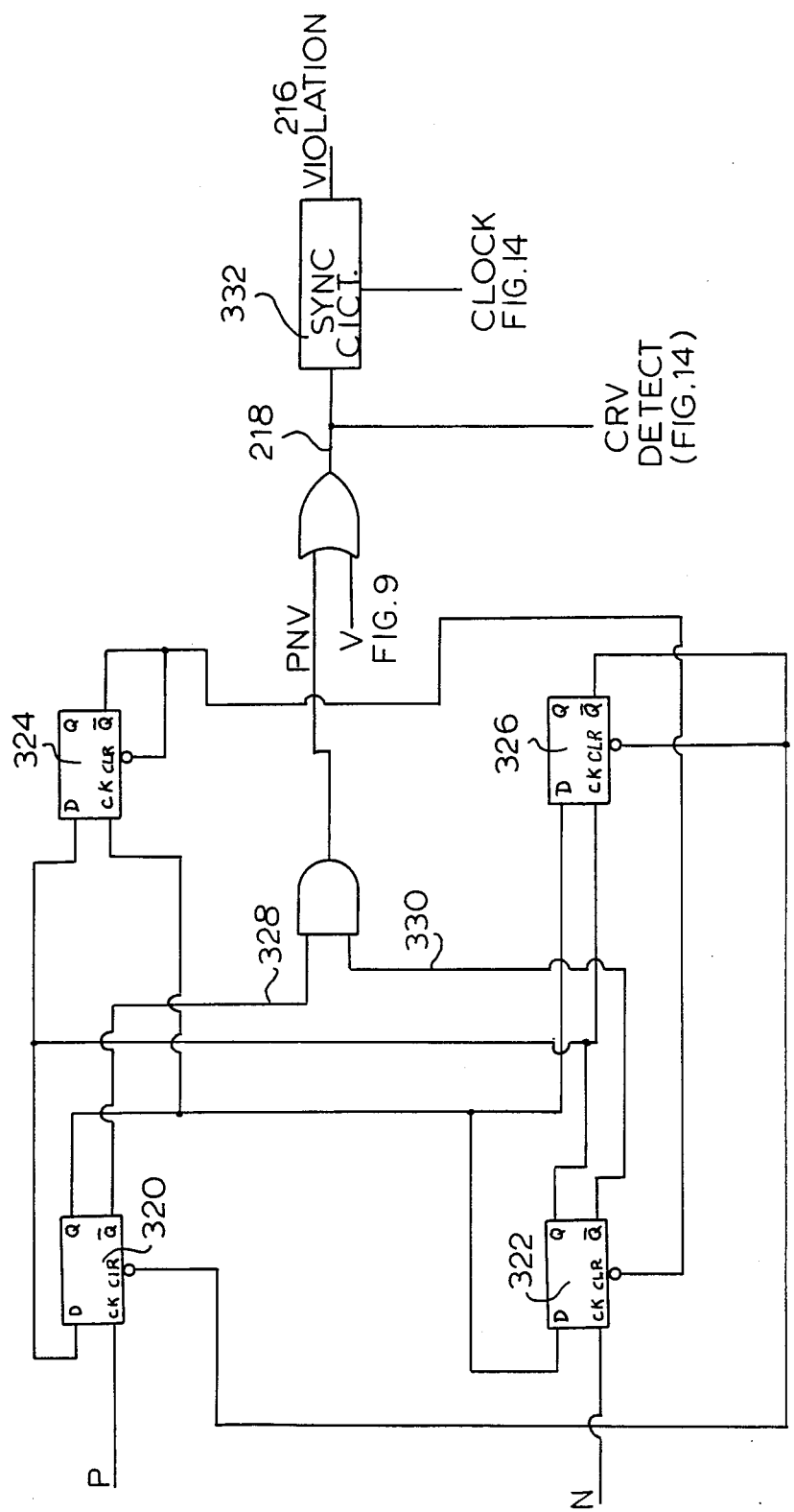
FIG. 10 shows details of the CRV detection circuit for that section of FIG. 8.

The signals on lines P, N & V are also used on FIG. 10 for the detection of the CRV signal as follows. The signal on line P indicates that a positive "1" data bit has been received. This signal is latched into flip-flop 320. The signal on line N indicates that a negative "1" data bit has been received. With CMI coding the pulses at P and N will always alternate (P, N, P, N, P, N, etc.) unless a violation of this rule occurs (CRV). Flip-flops 324 & 326 reset flip-flops 322 & 320 respectively, i.e., when flip-flop 322 receives pulse N, flip-flop 326 will in turn reset flip-flop 320 (ready for pulse P). This circuit is used to save the manner in which the last "1" data bit has been received. Thus a high output on flip-flop output line 328 indicates that the last "1" bit has resulted from two consecutive positive 1's, i.e., a CRV has occurred. This logic circuit compares the pulse inputs to flip-flops 320 and 322 to determine whether alternating 1's have occurred as required by the CMI coding. If this requirement is not met, a CRV signal on line PNV is the result. This circuit will not recognize a CRV that is adjacent to another "1"bit. However, the output of gate 294 on FIG. 9 provides this function. Line 218 provides the combined CRV indications. Synchronization of these CRVs is required and accomplished by circuit 332 using the CLOCK as input.

Figure 11:
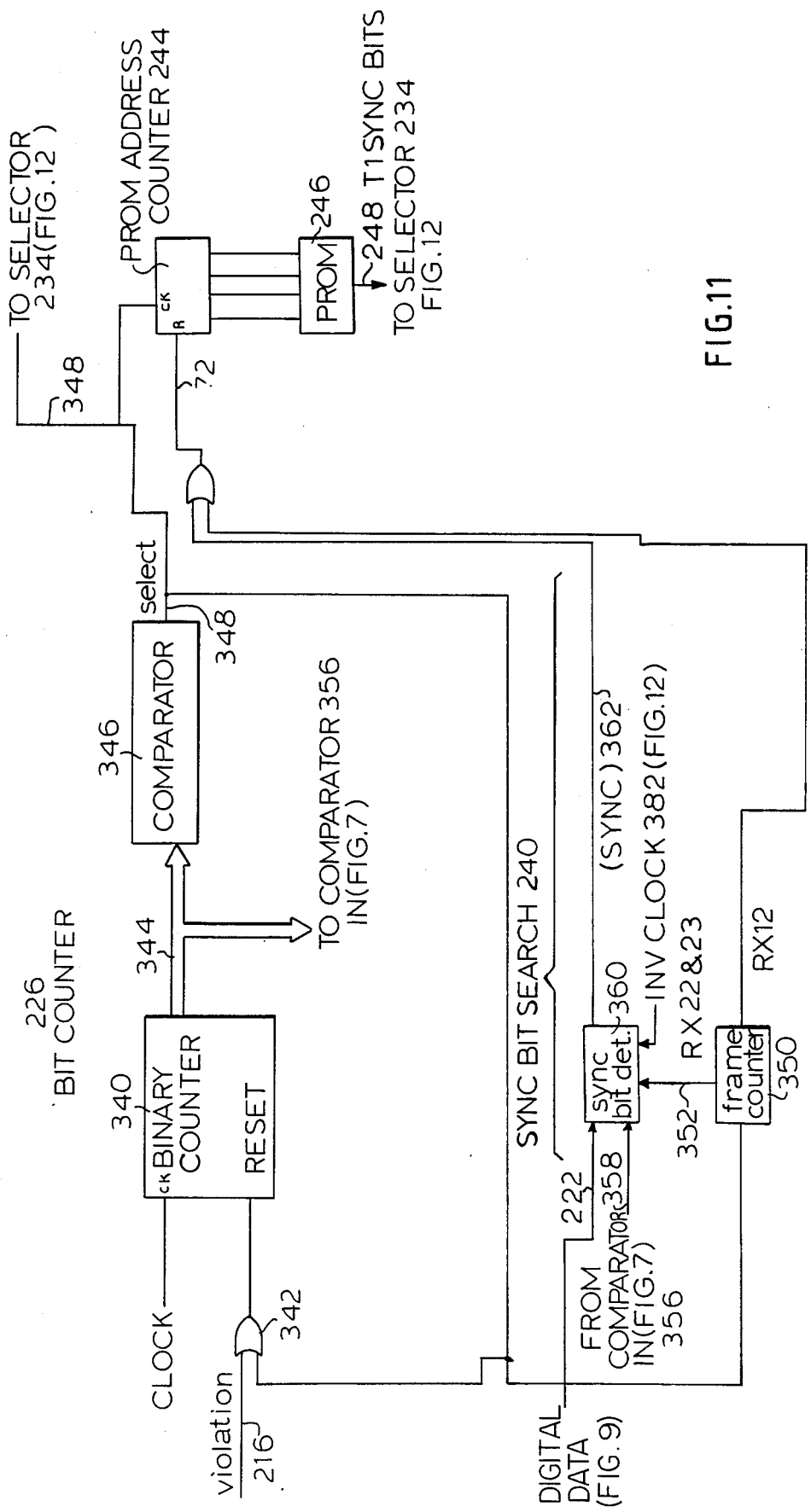
FIG. 11 shows details of the sync bit search circuit for that section of FIG. 8.

Referring now to FIG. 11, the bit counter 226 comprises a binary counter 340 which counts clock pulses that correspond to bit periods. The violation signal on line 216 (from FIG. 10) resets the counter and initiates its count through OR gate 342. The output of counter 340 appears on a multiple parallel bus 344 which is fed to a comparator 346. The comparator 346 is prestrapped to a preselected value (i.e. 193) in this case and when it detects this value on bus 344, a SELECT signal is generated on line 348, signifying the beginning of a 193 bit frame. This select signal is used to substitute whatever bit value is present as the first bit of each frame, with the desired T1 frame bit stored in PROM 246. After this bit substitution has occurred at selector 234 (FIG. 12), the same select signal will then increment from address counter 244 to set up the next T1 SYNC bit (at line 248) for insertion at the next select signal. The SELECT signal is also used to reset binary counter 340 through OR gate 342 and is also fed to a frame counter 350. Frame counter 350 generates an RX22 and RX23 signal on line 352 corresponding to frames 22 and 23 of the NTT interface.

Bus 344 is also fed to another comparator 356 in FIG. 7. This comparator compares the count from counter 340 to the value preset on DIP switch 160 described above. When a concurrence is found, comparator 356 generates an output on line 358 indicating that secondary framing bit position is present in a frame. This line 358 is fed back to a first sync bit detector 360 shown on FIG. 11. Sync bit detector 360 also receives data bits from line 222 and an RX22 and RX23 signal on line 352. The purpose of detector 360 is to detect the secondary sync bits. If the correct bits are received in their bit positions, a signal is sent on line 362 two frames later indicating the first bit of a frame group (frame 1, bit 1). In other words, if the correct bit is received in frame 22 and frame 23, then an output is generated on line 362, delayed by one frame (24) whereby a signal is generated at the beginning of the first frame on line 362.

A PROM address counter is incremented with every pulse on the SELECT line 348, and is reset by a pulse on line 372. The address counter generates sequential addresses for PROM 246 which provide the appropriate sync bits for the T1 interface on line 248.

Figure 12:
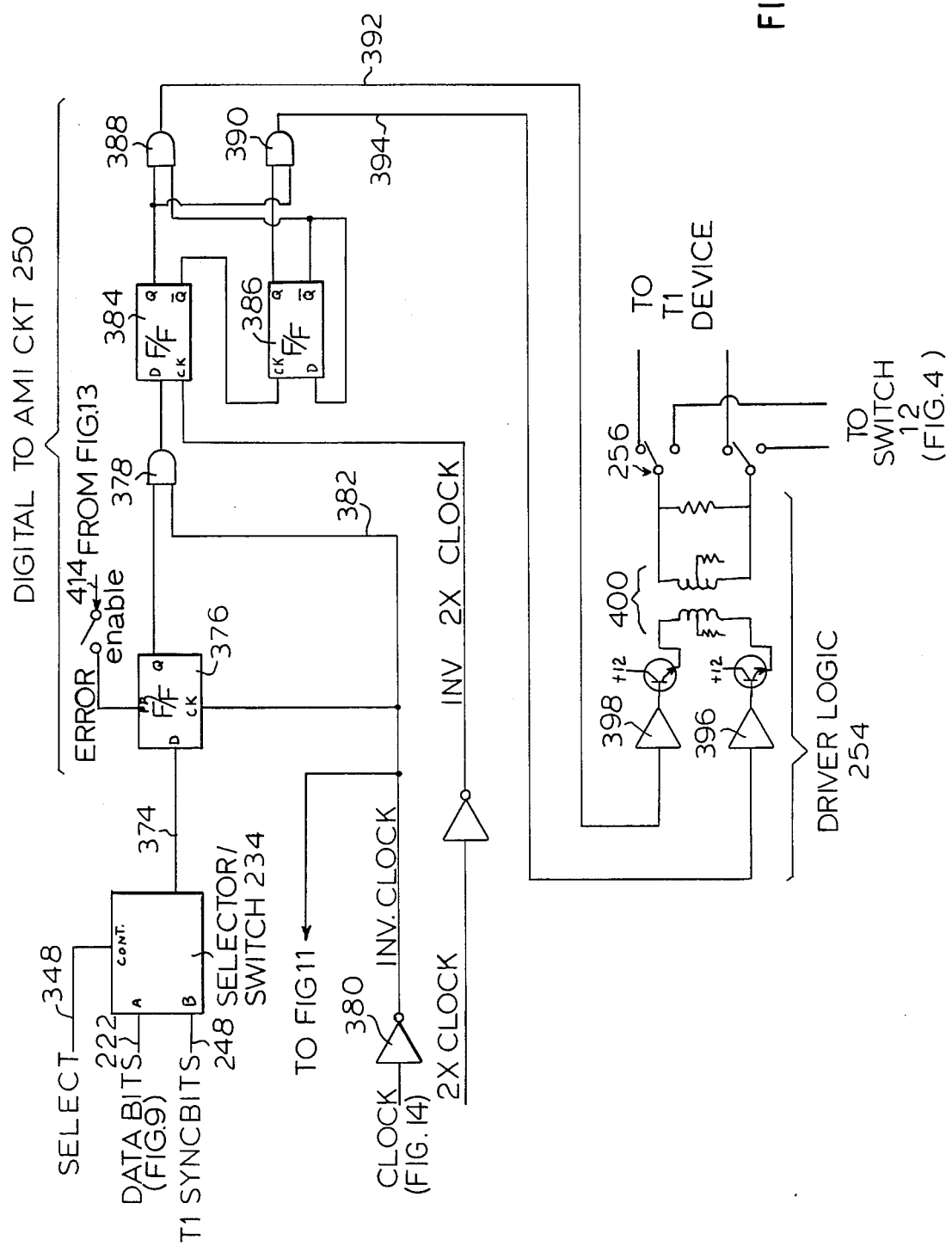
FIG. 12 shows details of the digital-to-AMI circuit and the driver logic circuit for the converter section of FIG. 8.

In FIG. 12, selector switch 234 has two inputs A,B connected respectively to data line 222 and T1 sync bit line 248. The selector also has a control input connected to SELECT line 348. In accordance with the pulses on line 348, at the beginning of each frame, selector 234 stuffs one sync bit from line 248 on output line 374. Thereafter data bits from line 248 are transmitted until the beginning of the next frame.

From selector 234, line 374, the bits are transmitted to a flip-flop 376 and then to an AND gate 378. The clock signal is inverted by an inverter 380 to generate an inverted clock signal on line 382. AND gate 378 is enabled by the inverted clock signal to pass the signals from flip-flop 376 to two flip-flops 384,386. These flip-flops, together with AND gates 388,390 cooperate to generate pulses on lines 392,394 corresponding to "1" bits from flip-flop 376. Each "1" bit input from flip-flop 376 causes a pulse on either line 392 or 394, alternately in accordance with the AMI coding shown in FIG. 3. No pulses appear on either of these lines for a "0" bit.

FIG. 13 shows details of the display circuit 232. The SELECT signal indicating the beginning of each frame is fed to a frame counter 402. This counter counts frames and provides the frame count to a logic circuit 404. Logic circuit 404 monitors the first data bit of each frame (received on line 222) to determine whether one of the NTT information type bits is received (FIG. 2). For example during the 17th frame a DNR bit is expected, during the 19th frame an REC bit is expected, and so on. The circuit 404 drives three indicating lamps 406,408,410 to indicate when an abnormal sync signal has been received. In addition the outputs to LED's 406 and 408 are combined by an OR gate 412 to generate an error signal on line 414. Line 414 is used by the flip-flop 376 in FIG. 12 to strap its output to "one" whereby all other data bits are suppressed until the error is corrected. This error function is optional and can be enabled or disabled via "enable" switch on line 414 in FIG. 12.

The NTT clock signal generating circuit is shown in FIG. 14. It comprises a free-running clock circuit 420 generating an output 2X CLOCK on line 224 at 3.088 MHz. A frequency divider flip-flop 422 is used to derive a 1.544 MHz CLOCK signal on line 221. Flip-flop 422 is synchronized to the data via clock/data sync circuit 424 using the CRV signal from FIG. 10, thereby ensuring that the rising edge of "CLOCK" occurs at the beginning of a bit time.

FIG. 16 is a table providing the hexadecimal value for each bit position within the frames for the secondary framing function. When selecting the desired bits for secondary framing, one can use the hexadecimal value shown in the table of FIG. 15. There are 11 bits that cannot be used: the first (F) bit (used for framing), bit "0" of channel 1, bit "B7" of channel 23, and all eight bits of channel 24. Any bits from bit "1" of channel 1 through bit "B6" of channel 23 can be used as a secondary frame bit.

FIGS. 17A and 17B are graphical representations of various signals in the inventive circuits when CMI data is converted to a digital representation as shown in FIG. 9. In the FIG. 280 represents the first shift of the CMI coded signal. The bit sequence is "10111". 278 represents the second shift of the same signal. P is the result of "ANDing" signals 280 and 278 from FIG. 9 and is a pulse for each positive going "1" bit. N is the result of inverting 280 and 278 before they are "ANDed" together creating a pulse for each negative going "1" bit. 276 and 264 are output signals from shift register 272 as shown in FIG. 9. PV is a signal showing of a pulse for each positive CRV.

Figure 18:
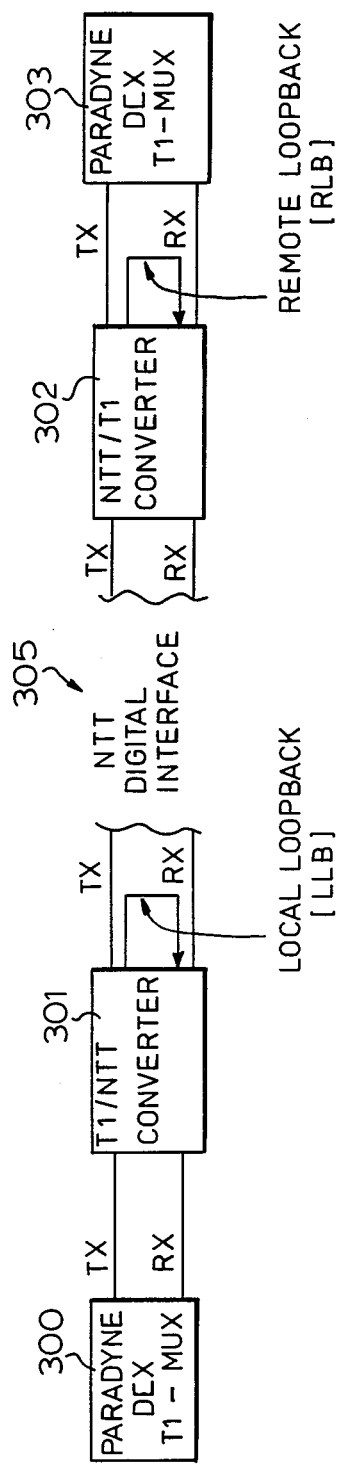
FIG. 18 demonstrates an example configuration and loopback functions.

The switches at the inputs and output of the converter sections are used to provide loopback for testing. FIG. 18 shows Paradyne multiplexer 300 exchanging information with T1/NTT converter 301 which in turn is connected to converter 302 across digital interface 305. Converter 302 exchanges information with Paradyne Multiplexer 303. Thus if switch 34 in FIG. 4 is set to engage local loopback, then NTT-type signals are sent from FIG. 4 and received on line 204 of FIG. 8. If switch 256 of FIG. 12 is set for loopback then the converter is adapted to loopback T1-type signals. This is the remote loopback function. These 2 types of loopback can be seen in FIG. 18.

Obviously numerous modifications can be made without departing from the scope of the invention as defined in the appended claims.

I claim:

1. A converter for converting AMI encoded data signals of a first interface into CMI encoded data signals of a second interface, said converter comprising:

a receiver logic circuit for converting signals from a device operating under said first interface to said CMI encoded signals of said second interface;

means for converting said AMI encoded signals of said first interface to standard bilevel digital signals;

means for adding sync bits to said standard bilevel digital signals;

means for converting said standard bilevel digital signals to said CMI encoded signals of said second interface; and driver logic for converting said CMI encoded signals of said second interface into signals to be transmitted on a network operating under said second interface.

2. A bidirectional converter for converting AMI encoded data signals of a first interface into CMI encoded data signals of a second interface and vice versa, said converter comprising:

a first section comprising a receiver logic circuit for converting signals from a device operating under said first interface into said CMI encoded signals of said second interface;

means for converting said AMI encoded signals of said first interface to first standard bilevel digital signals;

means for adding sync bits to said first standard bilevel digital signals;

means for converting said first standard bilevel digital signals to said CMI encoded signals of said second interface;

drive logic for converting said CMI encoded signals of said second interface into signals capable of being transmitted on a network operating under said second interface;

a second section comprising a second receiver logic circuit for converting signals from said network operating under said second interface to said AMI encoded signals of said first interface;

means for converting said CMI encoded signals of said second interface to second standard bilevel digital signals;

means for adding sync bits to said second standard bilevel digital signals;

means for converting said second standard bilevel digital signals to said AMI encoded signals of said first interface; and driver logic for converting said AMI encoded signals of said first interface into signals to be transmitted to said device operating under said first interface.

3. The bidirectional converter of claim 2 further comprising switching means for selectively switching said signals capable of being transmitted on said network operating under said second interface to said network or to said second receiver logic circuit of said second section.

4. The bidirectional converter of claim 2 further comprising switching means for selectively switching said signals to be transmitted to said device operating under said first interface to said device or to said receiver logic circuit of said first section.

5. The converter of claim 1 wherein said means for converting said standard bilevel digital signals to AMI encoded signals of said second interface comprises a clock generator, said clock generator comprising a digital clock operator which outputs a clock signal at a first frequency, a clock/data sync circuit having an input connected to T1 data signals at a first frequency, a coding rule violation (CRV) insertion circuit provided for said second interface, and a frequency divider flip-flop circuit outputting a clock signal at a second frequency divider.

6. The bidirectional converter of claim 2 wherein said means for converting said first standard bilevel digital signals to said CMI encoded signals of said second interface comprises a clock generator, said clock generator comprising a digital clock operator which outputs a clock signal at a first frequency, a clock/data sync circuit having an input connected to said CMI data stream at a first frequency and coding rule violation (CRV) detect input, and a frequency divider flip-flop circuit connected to an output of said clock data circuit, said frequency divider flip-flop circuit outputting a clock signal at a second frequency.

* * * * *